US009786516B2

(12) United States Patent
Minotti et al.

(10) Patent No.: US 9,786,516 B2
(45) Date of Patent: *Oct. 10, 2017

(54) POWER DEVICE HAVING REDUCED THICKNESS

(71) Applicant: STMicroelectronics S.r.l., Agrate Brianza (IT)

(72) Inventors: Agatino Minotti, Cantania (IT); Cristiano Gianluca Stella, San Gregorio di Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 14/946,871

(22) Filed: Nov. 20, 2015

(65) Prior Publication Data

US 2016/0079092 A1 Mar. 17, 2016

Related U.S. Application Data

(62) Division of application No. 13/535,636, filed on Jun. 28, 2012, now Pat. No. 9,275,943.

(30) Foreign Application Priority Data

Jun. 30, 2011 (IT) .............................. MI2011A1214

(51) Int. Cl.
*H01L 21/52* (2006.01)
*H01L 23/433* (2006.01)
(Continued)

(52) U.S. Cl.
CPC .............. *H01L 21/52* (2013.01); *H01L 21/56* (2013.01); *H01L 23/3114* (2013.01);
(Continued)

(58) Field of Classification Search
CPC ............. H01L 23/3107; H01L 23/4334; H01L 23/49562; H01L 23/49524
(Continued)

(56) References Cited

U.S. PATENT DOCUMENTS 3,548,927 A 12/1970 Spurling
3,670,215 A 6/1972 Wilkens et al.
(Continued)

FOREIGN PATENT DOCUMENTS

EP 0812015 A1 12/1997
EP 0948047 A2 10/1999
(Continued)

OTHER PUBLICATIONS

Italian Search Report and Written Opinion for IT MI2011A001214 mailed Jan. 27, 2012 (8 pages).
(Continued)

*Primary Examiner* — Bo Fan
(74) *Attorney, Agent, or Firm* — Gardere Wynne Sewell LLP (57) ABSTRACT

An electronic device includes at least one chip and an insulating body embedding the chip. The electronic device further includes a heat-sink in contact with the chip. The heat-sink includes a plate having a first thickness. A recess is provided in the plate that defines a central portion of the plate having a second thickness less than the first thickness. The chip is mounted to the central region of the heat-sink within the recess. The insulating body includes a surface, such as a mounting surface, including an opening exposing at least a portion of the heat-sink. The device may further include a reophore extending through a side surface of the insulating body, that reophore being in contact with the heat sink.

12 Claims, 5 Drawing Sheets

(51) Int. Cl.
*H01L 23/495* (2006.01)
*H01L 21/56* (2006.01)
*H01L 23/367* (2006.01)
*H01L 23/31* (2006.01)

(52) U.S. Cl.
CPC ...... *H01L 23/3675* (2013.01); *H01L 23/4334* (2013.01); *H01L 23/49524* (2013.01); *H01L 23/49562* (2013.01); *H01L 23/3107* (2013.01); *H01L 2224/32245* (2013.01); *H01L 2924/1301* (2013.01); *H01L 2924/13055* (2013.01); *H01L 2924/13062* (2013.01); *H01L 2924/13091* (2013.01)

(58) Field of Classification Search
USPC .......................................... 438/122; 257/712
See application file for complete search history.

(56) References Cited

U.S. PATENT DOCUMENTS

| | | | |
|---|---|---|---|
| 4,147,889 A | 4/1979 | Andrews et al. | |
| 4,254,447 A | 3/1981 | Griffis | |
| 4,611,238 A | 9/1986 | Lewis et al. | |
| 4,748,538 A | 5/1988 | Tsuji | |
| 4,849,856 A | 7/1989 | Funari et al. | |
| 4,918,571 A | 4/1990 | Grabbe | |
| 5,311,395 A | 5/1994 | McGaha et al. | |
| 5,504,652 A | 4/1996 | Foster et al. | |
| 5,546,275 A | 8/1996 | Moutrie et al. | |
| 5,977,630 A | 11/1999 | Woodworth et al. | |
| 6,054,759 A | 4/2000 | Nakamura | |
| 6,097,603 A | 8/2000 | Edwards et al. | |
| 6,150,254 A | 11/2000 | Kito | |
| 6,178,628 B1 | 1/2001 | Clemens et al. | |
| 6,707,676 B1 | 3/2004 | Geva et al. | |
| 6,833,997 B1 | 12/2004 | Jones, III et al. | |
| 7,145,224 B2 | 12/2006 | Kawashima et al. | |
| 7,247,929 B2 | 7/2007 | Miura et al. | |
| 7,286,361 B2 | 10/2007 | Yamanaka | |
| 7,746,650 B2 | 6/2010 | Hellinger et al. | |
| 7,776,658 B2 | 8/2010 | Liu et al. | |
| 7,816,784 B2 | 10/2010 | Son et al. | |
| 7,851,908 B2 | 12/2010 | Otremba et al. | |
| 7,892,893 B2 | 2/2011 | Obara | |
| 8,062,932 B2 | 11/2011 | Hebert et al. | |
| 8,154,108 B2 | 4/2012 | Liu et al. | |
| 8,358,017 B2 | 1/2013 | Tsui | |
| 8,390,041 B2 | 3/2013 | Yoshimochi | |
| 8,481,368 B2 | 7/2013 | Xue et al. | |
| 8,604,611 B2 | 12/2013 | Hauenstein | |
| 2002/0158333 A1 | 10/2002 | Teshima | |
| 2004/0063246 A1 | 4/2004 | Karnezos | |
| 2005/0161785 A1 | 7/2005 | Kawashima et al. | |
| 2005/0280140 A1 | 12/2005 | Corbin et al. | |
| 2006/0091512 A1 | 5/2006 | Shinohara | |
| 2007/0090523 A1 | 4/2007 | Otremba | |
| 2007/0108564 A1 | 5/2007 | Tang et al. | |
| 2007/0132091 A1* | 6/2007 | Wu | H01L 21/4828 257/706 |
| 2007/0215996 A1 | 9/2007 | Otremba | |
| 2008/0054422 A1 | 3/2008 | Koike et al. | |
| 2009/0057865 A1* | 3/2009 | Brodsky | H01L 23/3121 257/687 |
| 2009/0115041 A1* | 5/2009 | Igarashi | H01Q 23/00 257/679 |
| 2009/0236732 A1 | 9/2009 | Yu et al. | |
| 2009/0323288 A1 | 12/2009 | Bernard | |
| 2010/0133674 A1 | 6/2010 | Hebert et al. | |
| 2011/0096509 A1 | 4/2011 | Yoshimochi | |
| 2013/0003305 A1 | 1/2013 | Stella | |
| 2013/0003308 A1 | 1/2013 | Stella | |
| 2013/0003311 A1 | 1/2013 | Privitera et al. | |
| 2013/0003312 A1 | 1/2013 | Stella et al. | |

FOREIGN PATENT DOCUMENTS

| | | |
|---|---|---|
| JP | 49047567 U | 4/1974 |
| JP | 58218149 A | 12/1983 |
| JP | 62104056 A | 5/1987 |
| JP | 4368155 A | 12/1992 |
| JP | 6037217 A | 2/1994 |
| JP | 8078584 A | 3/1996 |
| WO | WO-2006058030 A2 | 6/2006 |

OTHER PUBLICATIONS

Definition of "Cavity" from Dictionary.com.
Definition of "Channel" from Dictionary.com.

* cited by examiner

POWER DEVICE HAVING REDUCED THICKNESS

CROSS REFERENCE TO RELATED APPLICATIONS

This application is a divisional from U.S. application for patent Ser. No. 13/535,636 filed Jun. 28, 2012, which claims priority from Italian Application for Patent No. MI2011A001214 filed Jun. 30, 2011, the disclosures of which are incorporated by reference.

TECHNICAL FIELD

The solution according to one or more embodiments of the present invention relates to the electronics field. More specifically, such solution relates to electronic devices.

BACKGROUND

Each electronic device typically includes a chip—for example, of semiconductor material, on which on one or more electronic components are integrated—and a package wherein the chip is encapsulated for protecting it and for allowing access to terminals thereof.

In this respect, the package typically includes an insulating body having exposed leads, each one of which is electrically connected to a corresponding terminal of the chip (for example, through a wire-bonding technique). The package leads are used for connecting the package (and hence the corresponding terminals of the chip) to external circuits. For such purpose, the electronic device is usually mounted on a printed circuit board (PCB), for example, by surface mounting technology (SMT), wherein the package leads include pads that are first fixed to corresponding conductive tracks of the PCB by means of a slight pressure (pick and place), and then reflowed on the same, or by through-hole technology (THT), wherein the package leads include reophores that are inserted into through holes of the PCB and back-welded on it.

As should be known, considerable design efforts are aimed at making more and more compact electronic devices.

In this respect, although advanced integration techniques currently exist that allow achieving a remarkable reduction in the size of the chip, the reduction of the overall size of the corresponding electronic device may still be not significant.

This may occur, for example, when the size of the electronic devices mainly depend on the size of the respective package, as in case of electronic device for power applications (e.g., motor and power suppliers control), or power device, which includes one or more power components integrated on the chip.

For example, a very common class of power components is represented by vertical structure MOS power transistors; the latter, being affected by high voltages (such as 5.5 V-850V), are subject to considerable heating during operation thereof. For this reason, the chip on which the power component is integrated needs a package that, in order to ensure adequate heat dissipation properties (so as to avoid overheating phenomena to the chip that may cause malfunctioning or breakages), is provided with one or more heat-sinks for dissipating the heat generated by the chip during operation thereof to the outside.

An example of such a package is the DSC ("Dual Side Cool") package, which is provided with two separate heat-sinks. In particular, each power device having a DSC package (or DSC power device) includes a heat-sink extending between a conductive region of the chip (e.g., a drain terminal of the power transistor) and a mounting surface of the insulating body facing the PCB, and a further heat-sink extending between another conductive region of the chip (e.g., a source terminal of the power transistor) and a free surface of the insulating body (typically opposite the mounting surface).

As should be known, an increasing number of applications require that the DSC power devices have very small size (e.g., thickness lower than 1 mm, which may be referred to as sub-millimeter thickness); however, since shape and/or size of heat-sinks, leads, insulating body and terminals should comply with specific safety parameters of the DSC power device (for example, air distances—creepage distances—and/or surface distances—clearance distances), a reduction in the thickness of the DSC power device would imply such structural changes to require an at least partial redesign of the same. Since this would imply timing and/or costs often not compatible with market requirements, currently there are no sub-millimeter thickness DSC power devices being commercially available.

Furthermore, as should be known, a chip may integrate one or more high power components within it (i.e., able to withstand operating voltages higher than 300V, and up to 850V), so that it is more subject to overheating. For this reason, a chip of this kind needs to be encapsulated within a DSC package having better dissipation capacity (e.g., by using heat-sinks having a larger dissipation surface).

However, an increase of the dissipation surface of the heat-sinks, in addition to impact safety parameters (with the same problems described above), would involve a larger encumbrance of the corresponding DSC device. For the described reasons, there are no high-power DSC devices with limited encumbrance being commercially available.

SUMMARY

In its general terms, the solution according to one or more embodiments is based on the idea of forming at least one recess within the heat-sink.

In particular, one or more aspects of the solution according to specific embodiments are set out in the independent claims, with advantageous features of the same solution that are indicated in the dependent claims, whose wording is enclosed herein verbatim by reference (with any advantageous feature provided with reference to a specific aspect of the solution according to an embodiment that applies mutatis mutandis to any other aspect thereof).

More specifically, an aspect of the solution according to an embodiment proposes an electronic device (for example, a power device). The electronic device includes at least one chip wherein at least one electronic component (for example, one or more power components, such as a vertical structure power MOSFET transistor) is integrated, and an insulating body embedding said at least one chip. The insulating body has a mounting surface for the mounting on a board (for example, a PCB). The electronic device further includes a heat-sink in contact with said at least one chip (for example, in contact with a drain terminal thereof) for dissipating the heat produced by said at least one electronic component towards the mounting surface; the heat-sink includes a plate having a first thickness. In the solution according to an embodiment, the plate is provided with at least one recess that defines a portion of the plate with a second thickness lower than the first thickness. Said at least one chip is housed within said at least one recess.

Another aspect of the solution according to an embodiment proposes a corresponding package.

Another aspect of the solution according to an embodiment proposes a complex system including one or more of such electronic devices.

A further aspect of the solution according to an embodiment proposes a method for making the electronic device.

An embodiment of the method for making an electronic device comprises: forming a first recess in a first heat sink, said first recess peripherally surrounded by a side wall defining a first recess depth and having a first mounting surface at a bottom of the first recess having a mounting area; providing an electronic component integrated within a chip, the chip comprising a first conduction terminal on a first surface of the chip; and attaching the first surface of the chip to the first mounting surface of the first heat sink.

An embodiment of the method for making an electronic device comprises: providing an electronic component integrated within at least one chip, the at least one chip comprising a first conduction terminal on a first surface of the chip, and a second conduction terminal and a third conduction terminal on a second surface of the chip opposite said first surface, embedding said at least one chip within an insulating body, the insulating body having a mounting surface configured to mount on a board, providing a first heat-sink in contact with the first conduction terminal of said at least one chip for dissipating the heat generated by said at least one electronic component towards the mounting surface, the first heat-sink including a plate having a first thickness, the plate further provided with a first recess that defines a portion of the plate with a second thickness lower than the first thickness, providing a second heat-sink for dissipating the heat generated by said at least one electronic component towards a free surface of the insulating body opposite the mounting surface, the second heat-sink comprising a second recess, housing said at least one chip within said first recess, and contacting the second heat-sink to the second conduction terminal, the second recess of the second heat-sink extending over at least one portion of the third conduction terminal for insulating the third conduction terminal from the second heat-sink.

BRIEF DESCRIPTION OF THE DRAWINGS

The solution according to one or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION OF THE DRAWINGS

Figure 1A:
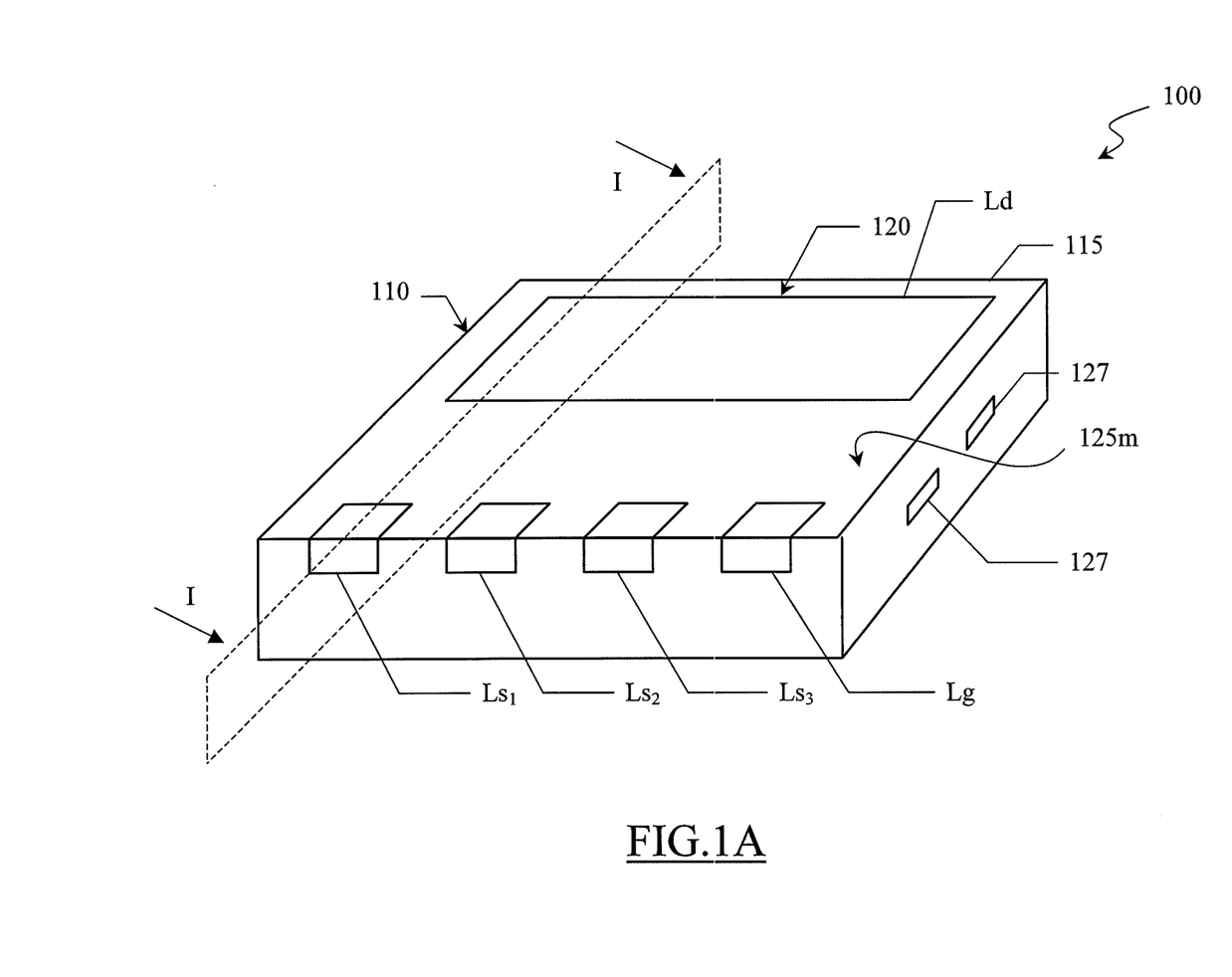
FIG. 1A shows a perspective representation of a known electronic device.

With particular reference to FIG. 1A, there is shown a perspective representation of an electronic device 100 (reversed with respect to a mounting direction thereof). For the sake of description simplicity, such figure will be discussed jointly with FIG. 1B, which shows a sectional view of the electronic device 100 along the plane I-I of FIG. 1A.

Figure 1B:
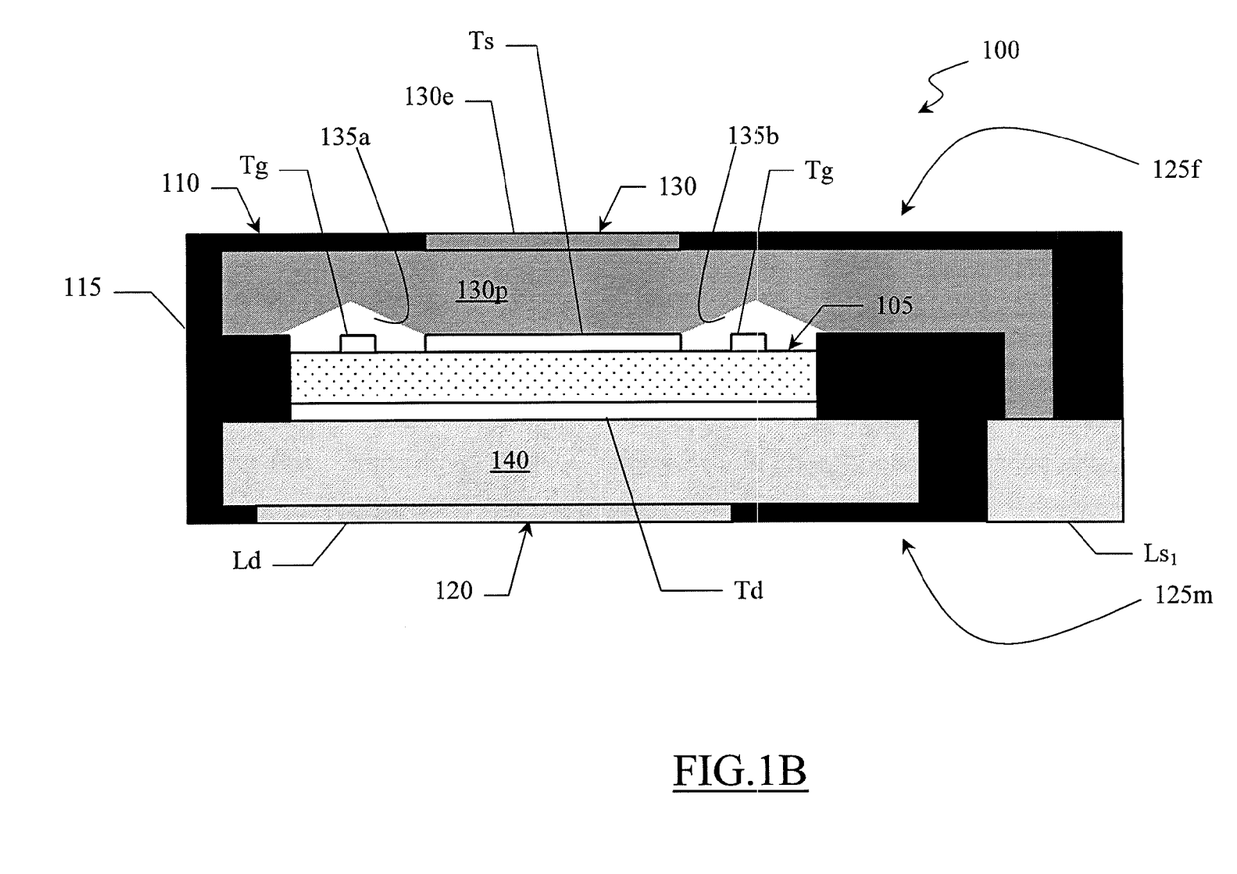
FIG. 1B shows a sectional view of such electronic device along the plane I-I of FIG. 1A.

The electronic device 100 may include a plurality of chips of semiconductor material, in each of which one or more electronic components may be integrated, and a package for encapsulating the chips.

In the exemplary but non limitative described embodiment, the electronic device 100 is an electronic device for power applications (for example, for motors and power supply control), or power device, and includes a single chip 105 on which a single power component is integrated (e.g., a vertical structure power MOS transistor having operating voltages between 5.5 V and 850V).

As better visible in FIG. 1B, the power device 100 includes a package 110, for example, of the DSC ("Dual Side Cool") type. In particular, the package 110 includes a generally parallelepiped-shaped insulating body (e.g., of plastic material) 115, which embeds the chip 105; the package 110 also includes a lower heat-sink 120 for dissipating the heat generated by the chip 105 towards a mounting surface 125m of the insulating body 115 (for mounting the power device 100 on a printed circuit board or PCB, not shown in the figure), and an upper heat-sink 130 for dissipating the heat generated by the chip 105 towards a free surface 125f of the insulating body 115 opposite the mounting surface 125m.

The chip 105 has a first conduction terminal Td (for example, a drain terminal of the power transistor) extending on a surface of the chip 105 facing the heat-sink 120, a second conduction terminal Ts (for example, a source terminal of the power transistor) extending on a surface of the chip 105 facing the heat-sink 130, and a control terminal Tg (for example, a gate terminal of the power transistor) extending on the surface of the chip 105 facing the heat-sink 130 also, substantially surrounding the terminal Ts.

As it is visible in FIG. 1B, the heat-sink 120, 130 contacts the terminal Td, Ts, respectively. More in particular, the heat-sink 130 includes a plate 130p of conductive material with one or more recesses (two, in the example being shown) 135a, 135b for electrically insulating the terminal Tg from the heat-sink 130 (thereby avoiding short-circuits between the terminal Tg and the terminal Ts). Instead, the heat-sink 120 includes a solid plate 140 of conductive material.

The package 110 further includes a plurality of leads (five, in the exemplary embodiment being shown) Ld, Ls$_1$, Ls$_2$, LS$_3$, and LG, which are connected to respective terminals of the chip 105 (for making the latter accessible from the external of the power device 100) and are suitable to allow the mounting of the power device 100 on the PCB by surface mounting technology (or SMT).

In this respect, the lead Ld is formed by a generally rectangular-shaped pad of metal material extending on about one third of the mounting surface 125m of the insulating body 115; such pad is connected to the plate 140, so as to represent an exposed portion of the heat-sink 120; therefore, it is electrically connected to the terminal Td, so as to act both as lead for accessing the terminal Td and as heat dissipation surface. It should be noted that a similar exposed pad, denoted by the reference 130*e*, is also provided within the heat-sink 130 (in contact with the plate 130*p*); the pad 130*e*, although being in contact with the terminal Ts through the plate 130*p*, is usually used only as an additional heat dissipation surface or support surface on which an auxiliary heat-sink (not shown in the figure) may be mounted (for example, by gluing).

The leads $Ls_1$, $Ls_2$, $LS_3$ and Lg, evenly arranged along an edge of the mounting surface 125*m* opposite the lead Ld, are instead formed each one by a generally square-shaped exposed pad of metal material that extends partly on the mounting surface 125*m* and partly on an adjacent side surface of the insulating body 115; the leads $Ls_1$, $Ls_2$, $Ls_3$ contact the terminal Ts (through the heat-sink 130) and the lead Tg contacts the terminal Tg (through wire bonding, electrical connection being not shown).

The insulating body 110 also exposes free ends of electrically conductive tie-bars 127 (e.g., of metal material, only two visible in the figure), which are used for supporting the lead Ld during making of the package 110 and are cut after molding of the insulating body 115; the tie-bars 127 are arranged in pairs on side surfaces of the insulating body 115 wherein there are not the leads $Ls_1$, $Ls_2$, $Ls_3$, Lg, properly spaced apart from the latter.

As mentioned in the introductory part of the present document, the power device 100 herein illustrated, which typically has a thickness greater than 1 mm, has technological drawbacks, substantially related to the impossibility of reducing the thickness below such value (so as to obtain a sub-millimeter power device). In fact, for reducing the thickness of the power device 100 there would be necessary such structural changes of the plate 130*p* to require a redesign of the same (and in particular of the package thereof).

Figure 2:
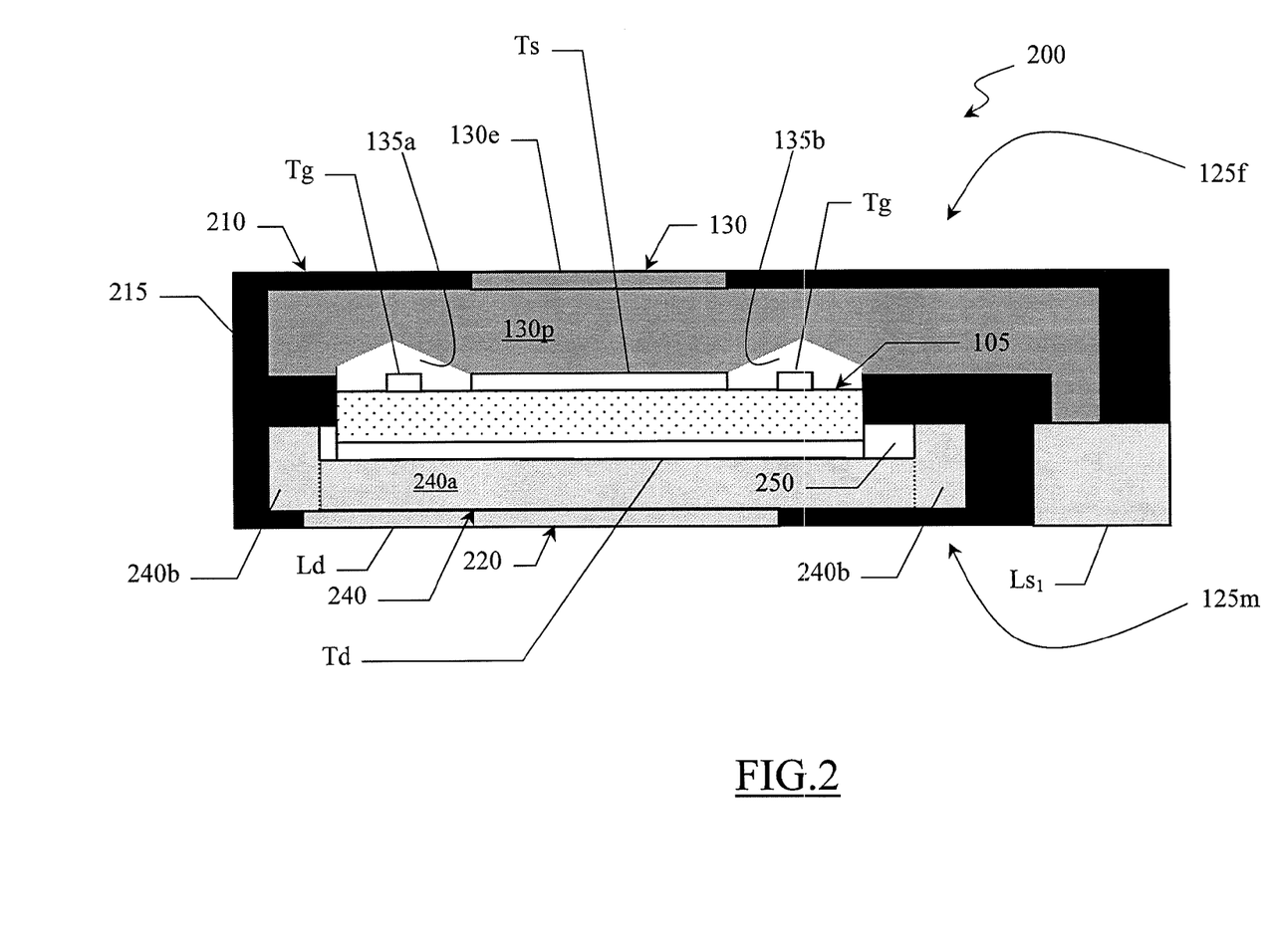
FIG. 2 shows a sectional view of an electronic device according to an embodiment.

Turning to FIG. 2, it shows a sectional view (analogous to the previous sectional view of FIG. 1B) of an electronic device 200 (e.g., still a power device) according to an embodiment. The power device 200 includes, as before, the chip 105 and a package 210 for encapsulating the latter.

In particular, the package 210 includes, as before, the upper heat-sink 130 and a lower heat-sink 220. The latter has a plate 240 of conductive material (with an exposed region that defines the lead Ld). As visible in the figure, the plate 240 is similar to the plate described above, but, differently from the latter, it has a recess 250 adapted to receive at least partly the chip 105 (in the exemplary but not limiting illustrated embodiment, the recess 250, having width greater and depth lower than the chip 105, completely houses the chip 105 in width, and partly in height). In particular, the recess 250 defines a portion 240*a* of the chip 240 having a lower thickness (on which portion 240*a* rests the chip 105), and a portion 240*b*, adjacent to the portion 240*a*, having a higher thickness (and equal to the thickness of the plate 140). For example, the portion 240*a* has a thickness preferably between 10% and 90%, still more preferably between 20% and 70%, for example, 30% (as shown in the figure) of the thickness of the portion 240*b*, and depending on the depth of the recess 250.

In this way, when encapsulating the chip 105, the chip will be at a lowered position (by the same depth of the recess 250) with respect to the previous case (FIG. 1B), as well as the heat-sink 130 will be; in this way, the insulating body 215 will have a thickness being lower by the same amount.

The described solution is advantageous as it allows obtaining more compact (for example, sub-millimeter) power devices with DSC package (or DSC power devices), whose thickness depends substantially on the depth of the recess 250. This is achieved by making few changes to the known power device. In this respect, it should be noted, in fact, that the insulating body 215 has a thickness lower than the insulating body 115, while having the same structure of the latter, and that the heat-sink 130 does not require deep changes, other than those strictly necessary to meet specific safety parameters, such as creepage distance (minimum distance on the surface of the insulating body between two conductive elements) and clearance distance (minimum air distance between two conductive elements).

In fact, each set of electrically conductive elements (e.g., pads, leads, reophores, tie-bars and the like) exposed from the insulating body and associated with (i.e., electrically connected to) a respective terminal, should be spaced apart by at least a creepage/clearance distance from the other sets of electrical conductive elements associated with the other terminals.

In the case at issue, since by reducing the thickness of the insulating body 215 the creepage distance (approximately equal to 2.7 mm) between the lead Ld and/or the pad 130*a* and the leads $Ls_1$, $Ls_2$, $Ls_3$ and/or the tie-bars 127 would be no longer met (and an electrical insulation between them would be no longer ensured), it might be necessary, in general, a resizing of the heat-sink 130; for example, it is possible to provide a slight reduction of the external lateral size of the pad 130*e* in the direction of the tie-bars 127 by an amount equal to the depth of the recess 250 (thus according to the thickness reduction of the insulating body 215). It should be noted that, still for ensuring a sufficient dissipation surface, such reduction may be compensated by a proper widening (compatibly with the design rules of the insulating body 215) of the pad 130*e* towards the leads $Ls_1$, $Ls_2$, $Ls_3$. Therefore, in the described solution the safety parameters of the power device will be met without requiring any substantial redesign of the plate 130*p*, but only by making simple structural changes to the package 105, and in particular to the pad 130*e*, without increasing the overall encumbrance thereof (length, width).

It should also be noted that, thanks to the presence of the recess 250 that reduces (in the portion 240*a*) the thickness of the plate 240, the heat-sink 220 has a lower thermal resistance. In addition, the plate 240 has a slightly larger dissipation surface (due to the greater width of the recess 250 with respect to the width of the chip 105, so that the heat may be dissipated also through internal side walls of the portion 240*b* that delimit the recess 250), which further decreases the thermal resistance of the heat-sink 220.

The described solution is further advantageous as it may be used for making high power devices that, for the same encumbrance with respect to those currently on the market, have better heat dissipation properties. In fact, in case that it is desired to use a chip (not shown) on which a high power component is integrated, the reduction of the thickness of the package (that the described solution allows obtaining) makes it possible to implement expedients (e.g., modifying the pad 130*e* or providing one or more auxiliary dissipation elements on it) whose space requirement may be substantially compensated by such reduction.

Figure 3A:
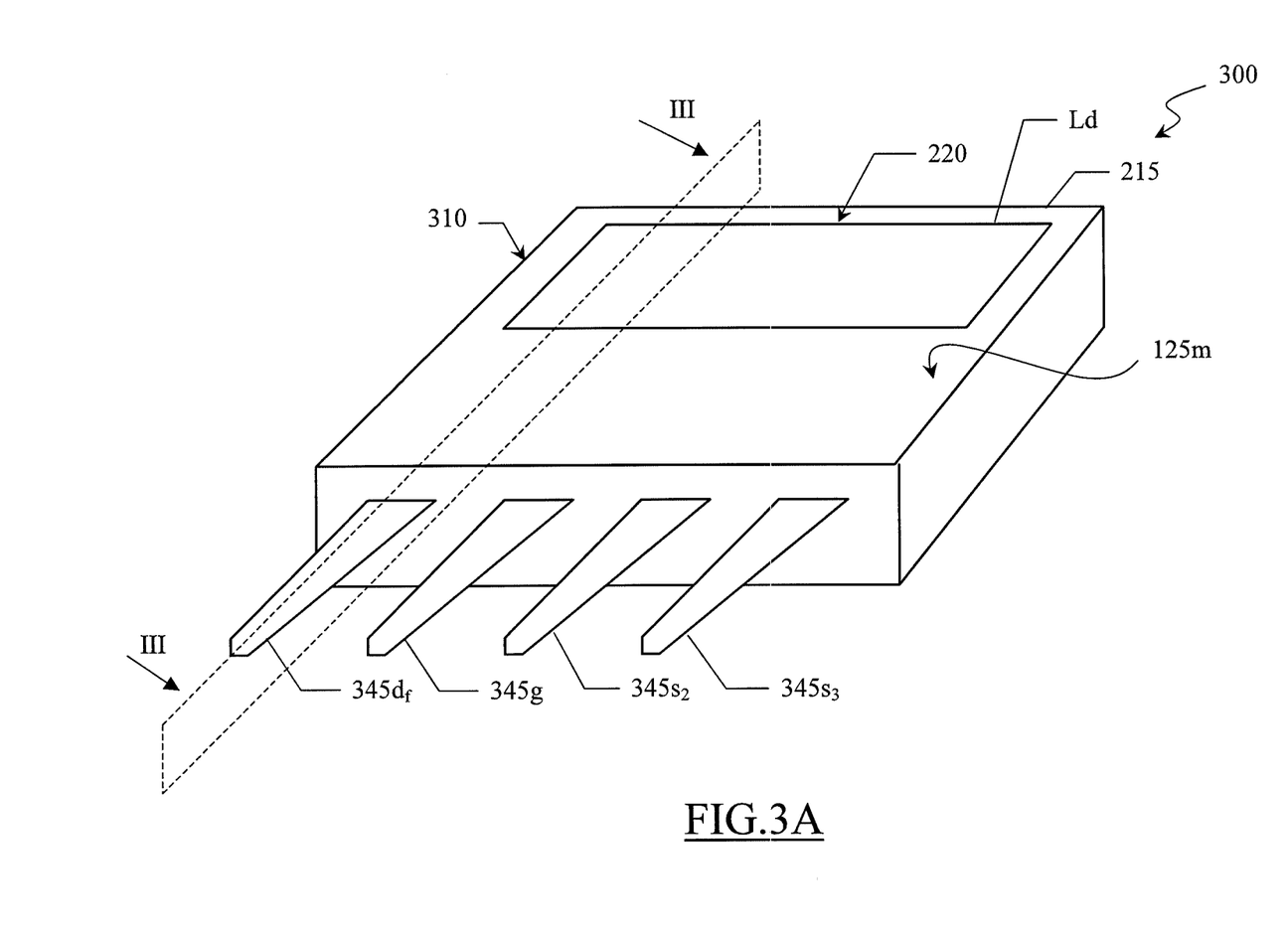
FIG. 3A shows a schematic representation of an electronic device according to another embodiment.
Figure 3B:
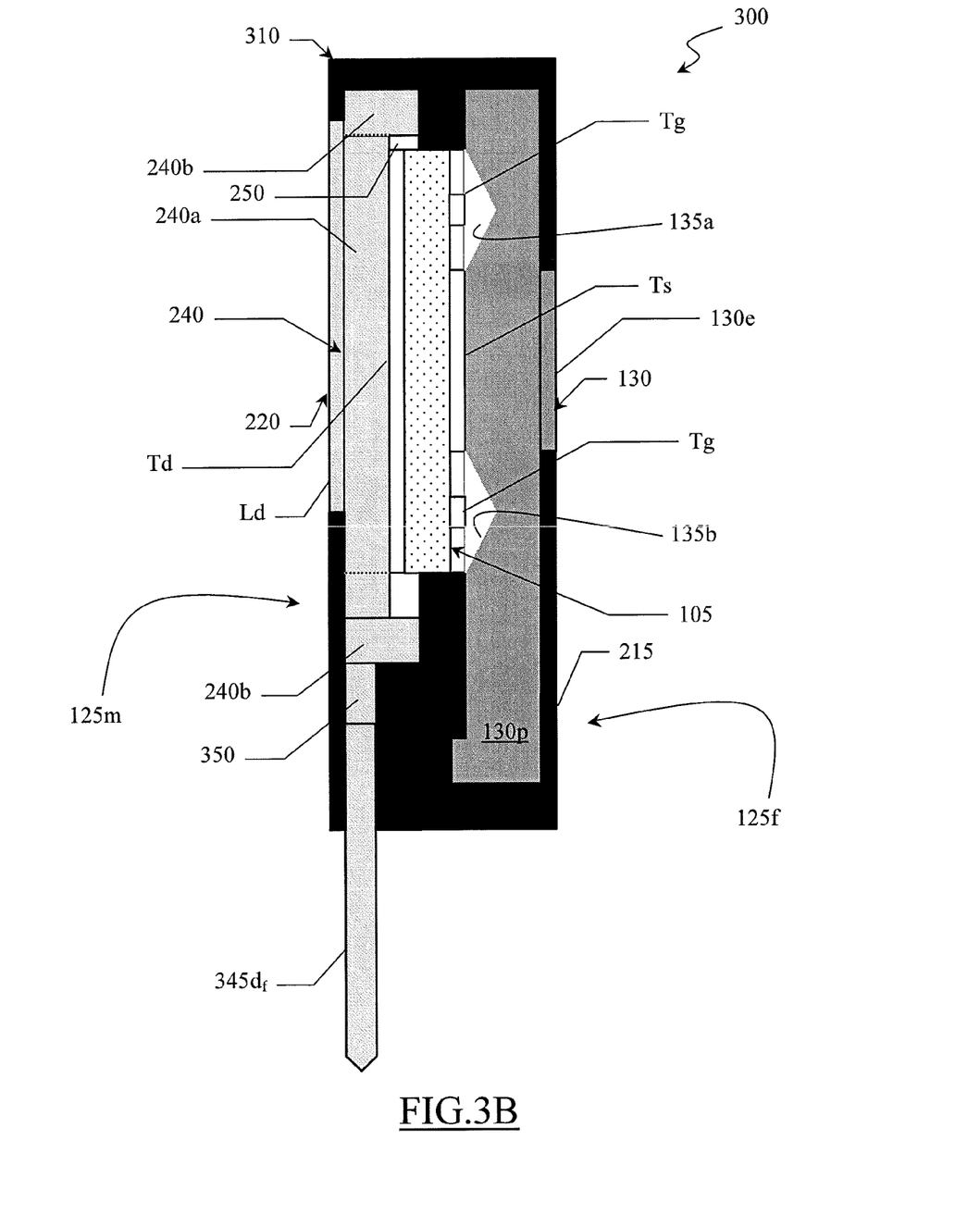
FIG. 3B shows a sectional view of such electronic device along the plane III-III of FIG. 3A.

Turning now to FIGS. 3A-3B, they show a schematic representation of an electronic device 300 (e.g., still a power device) according to another embodiment and a sectional view thereof along the plane III-III of FIG. 3A, respectively.

The power device 300 is substantially equivalent to the previous power device, but with respect to the latter is configured for being mounted on a PCB (not shown) by through-hole technology (THT). In this respect, the power device 300 includes a package 310 provided with elongated portions (reophores) $345d_f$, $345g$, $345s_2$ and $345s_3$ adapted to be inserted into through holes of the PCB and back-welded on it.

In order to allow also the terminal Td of the chip 105 to be mounted on the PCB by THT technology, while ensuring compliance with the creepage distances, the reophores $345g$, $345s_2$ and $345s_3$ of the power device 300 have a different configuration with respect to the corresponding leads used for the mounting by SMD technology (in this way, as will be explained shortly, it is possible to introduce a drain reophore). In particular, the reophores $345g$, $345s_2$ and $345s_3$ of the power device 300 extend from the side surface of the insulating body 215 in the positions that, in the previous embodiment, were taken by the leads Lg, $Ls_2$ and $Ls_3$, respectively. Instead, the position previously taken by the lead $Ls_1$ (source lead) is now taken by the lead $345d_f$ (drain reophore), which contacts the terminal Td. Such configuration, not limiting, allows meeting the creepage distances between the gate reophore $345g$ and the drain reophore $345d_f$, and between the drain reophore $345d_f$ and the source reophores $345s_2$, $345s_3$.

It will be understood that the reophore $345d_f$ may be connected to the terminal Td in various ways. For example, it may be connected through wire bonding (if possible) to the same terminal Td or to the plate 240; alternatively, as shown in FIG. 3B, the plate 240 may include an extension 350 that contacts the reophore $345d_f$ (internally to the package 310).

Advantageously, the PCB may include, in a known manner, a folded portion (also not shown) on which the exposed pad may be mounted for dissipating heat.

Naturally, in order to satisfy local and specific requirements, a person skilled in the art may apply to the solution described above many logical and/or physical modifications and alterations. More specifically, although embodiments have been described with a certain degree of particularity with reference to preferred embodiments thereof, it should be understood that various omissions, substitutions and changes in the form and details as well as other embodiments are possible. In particular, different embodiments may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

In particular, analogous considerations apply if the electronic device has a different structure or includes equivalent components. In any case, any component thereof may be separated into several elements, or two or more components may be combined into a single element; in addition, each component may be replicated for supporting the execution of the corresponding operations in parallel. It should also be noted that any interaction between different components generally does not need to be continuous (unless otherwise indicated), and it may be both direct and indirect through one or more intermediaries. For example, the described electronic device may include different chips, into each of which any component, electronic circuit, and/or electronic module (not necessarily of the power type) may be integrated. In such case, the lower heat-sink may include different recesses, each one of which may house a predetermined number of chips, down to one.

The illustrated shape of the insulating body is not to be construed in a limiting way, as well as type of materials and production process that may be used for the making thereof.

In addition, the lower heat-sink may also be not in direct contact with the chip; for example, intermediate layers (for example, coupling layers and/or welding layers) may be provided between the plate of the lower heat-sink and the drain terminal in order to ensure good adhesion properties (and hence efficient mechanical and/or electric coupling) between them. Moreover, it is possible to provide implementations wherein the heat coming from the chip may be transferred to the lower heat-sink mostly by convection.

The upper heat-sink may also be not provided, if not necessary. Moreover, the upper heat-sink, if provided, may protrude beyond the free surface and extend beyond it thereby taking a predetermined volume. In this respect, above the exposed pad of the upper heat-sink an auxiliary dissipation element may be provided, or the same exposed pad may be shaped so as to obtain a larger dissipation surface. As for the lower heat-sink, also the upper heat-sink may be not in contact with the chip. In any case, neither the lower heat-sink nor the upper heat-sink necessarily has to contact the access terminals, or other conductive regions, of the chip.

The described solution is particularly, but not exclusively, advantageous for chips integrating power components. However, the principles disclosed may be applied to other electronic devices wherein it is necessary to obtain reduced thickness by only minimally modifying pre-existing structures.

Anyway, the power component has been described by way of example only. In fact, the power component may be implemented, according to the various applications, through other components, such as MOSFET, IGBT, BJT, or JFET transistors, and/or diodes, thyristors, power amplifiers and/or power integrated modules. Moreover, the power MOS transistor to which reference has been made in the description may also have a different arrangement of its terminals.

Although in the description explicit reference has been made to specific operating voltages of the power components, they are not to be construed in a limiting way. For example, the same considerations apply to the power components that, thanks to more accurate, reliable and advanced production process, allow obtaining operating voltages even higher than the current ones (and hence exceeding 850V).

The number of leads of the package is not limiting, as well as their connections to the terminals of the chip (with any combination thereof that is possible). Moreover, the lead connected to the drain terminal may include more exposed pads of the lower heat-sink.

In addition, the upper heat-sink may also not be used for contacting the leads of the package at the source terminal, with such connection that may be made through wire bonding or other interconnection technique, possibly providing bumps. In a different embodiment, the upper heat-sink may contact the gate terminal (and possibly also the corresponding lead of the package).

Although in the description SMT and THT mounting techniques have been disclosed, the electronic device may be mounted on the board (or other suitable support) by any mounting technique.

Equivalent considerations apply to the package. In this respect, it should be noted that the package may be produced and marketed even as a stand-alone product, to be used for embedding one or more chips being separately provided.

Finally, the solution according to an embodiment lends itself to be implemented through an equivalent method (by using similar steps, removing some steps being not essential, or adding further optional steps); moreover, the steps may be performed in different order, concurrently or in an interleaved way (at least partly). Moreover, the desired result may be obtained both by directly making all the required components, or by using (at least partly) components provided by third parties already with the required features (e.g., chips and heat-sinks).

What is claimed is:

1. A method for making an electronic device that includes an electronic component integrated within a chip, the chip comprising a first conduction terminal on a first surface of the chip, and a second conduction terminal and a third conduction terminal on a second surface of the chip opposite said first surface, comprising:
    forming a first recess in a first heat sink, said first recess peripherally surrounded by a side wall defining a first recess depth and having a first mounting surface at a bottom of the first recess having a mounting area;
    attaching the first surface of the chip to the first mounting surface of the first heat sink;
    forming a second recess in a second heat sink;
    contacting the second heat sink to the second conduction terminal, the second recess of the second heat sink extending over at least one portion of the third conduction terminal for insulating the third conduction terminal from the second heat sink; and
    encapsulating the chip, the first heat sink and the second heat sink within an insulating body providing a mounting surface supporting mounting to a board.

2. The method of claim 1, wherein the mounting area exceeds a surface area of the first surface of the chip.

3. The method of claim 1, further comprising:
    providing a first external terminal exposed from the insulating body and connected to said second heat sink; and
    providing a second external terminal exposed from the insulating body and connected to the third conduction terminal.

4. The method of claim 3, wherein the first and second external terminals extend away from a side of the insulating body.

5. The method of claim 1, further comprising providing an external terminal exposed from the insulating body and connected to said first heat sink.

6. The method of claim 1, wherein forming the first recess comprises forming the first recess with a depth that is less than a thickness of the chip.

7. The method of claim 1, wherein attaching the first surface of the chip to the first mounting surface of the first heat sink further comprises positioning the chip within the first recess so that peripheral edges of the chip are offset from the side wall.

8. A method for making an electronic device, comprising:
    providing an electronic component integrated within at least one chip, the at least one chip comprising a first conduction terminal on a first surface of the chip, and a second conduction terminal and a third conduction terminal on a second surface of the chip opposite said first surface,
    embedding said at least one chip within an insulating body, the insulating body having a mounting surface configured to mount on a board,
    providing a first heat-sink in contact with the first conduction terminal of said at least one chip for dissipating the heat generated by said at least one electronic component towards the mounting surface, the first heat-sink including a plate having a first thickness, the plate further provided with a first recess that defines a portion of the plate with a second thickness lower than the first thickness,
    providing a second heat-sink for dissipating the heat generated by said at least one electronic component towards a free surface of the insulating body opposite the mounting surface, the second heat-sink comprising a second recess,
    housing said at least one chip within said first recess, and
    contacting the second heat-sink to the second conduction terminal, the second recess of the second heat-sink extending over at least one portion of the third conduction terminal for insulating the third conduction terminal from the second heat-sink.

9. The method of claim 8, further comprising encapsulating the first heat sink, second heat sink and chip within said insulating body.

10. A method for making an electronic device that includes an electronic component integrated within at least one chip, the at least one chip comprising a first conduction terminal on a first surface of the chip, and a second conduction terminal and a third conduction terminal on a second surface of the chip opposite said first surface, the method comprising:
    providing a first heat-sink including a first plate having a first thickness, the first plate further provided with a first recess that defines a portion of the first plate with a second thickness lower than the first thickness,
    housing said at least one chip within said first recess of the first heat sink in contact with the first conduction terminal of said at least one chip for dissipating heat away from said at least one electronic component,
    providing a second heat-sink having a second plate, the second plate further provided with a second recess,
    mounting the second heat-sink in contact with the second conduction terminal of said at least one chip for dissipating heat away from said at least one electronic component, the second recess of the second heat-sink further positioned to extend over at least one portion of the third conduction terminal for insulating the third conduction terminal from the second heat-sink; and
    embedding said at least one chip within an insulating body supporting mounting of the electronic device to a board.

11. The method of claim 10, wherein embedding further comprises embedding the first and second heat-sinks within the insulating body.

12. The method of claim 11, wherein embedding further comprises leaving a portion of the first heat-sink and a portion of the second heatsink exposed from the insulating body to provided first and second electrical contacts for the electronic device.

* * * * *